US010708532B2

(12) United States Patent
Ushinaga et al.

(10) Patent No.: US 10,708,532 B2
(45) Date of Patent: Jul. 7, 2020

(54) ANALOG-TO-DIGITAL CONVERTER AND SOLID-STATE IMAGE SENSOR

(71) Applicant: SHARP KABUSHIKI KAISHA, Sakai, Osaka (JP)

(72) Inventors: Takeo Ushinaga, Sakai (JP); Yoshinao Morikawa, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/534,835

(22) Filed: Aug. 7, 2019

(65) Prior Publication Data

US 2020/0053310 A1　Feb. 13, 2020

Related U.S. Application Data

(60) Provisional application No. 62/717,261, filed on Aug. 10, 2018.

(51) Int. Cl.
*H04N 5/374* (2011.01)
*H03M 1/34* (2006.01)
*H04N 5/3745* (2011.01)

(52) U.S. Cl.
CPC .......... *H04N 5/37455* (2013.01); *H03M 1/34* (2013.01)

(58) Field of Classification Search
CPC .... H04N 5/37455; H04N 5/378; H04N 5/357; H03M 1/34; H03M 1/123; H03M 1/1295; H03M 1/14; H03M 1/56
See application file for complete search history.

(56) References Cited

U.S. PATENT DOCUMENTS

| 10,419,003 | B1* | 9/2019 | Kim | H03M 1/0624 |
| 2009/0026352 | A1* | 1/2009 | Shimomura | H04N 5/3742 |
| | | | | 250/214 R |
| 2010/0253821 | A1* | 10/2010 | Yamamoto | H03K 4/02 |
| | | | | 348/294 |
| 2011/0074994 | A1* | 3/2011 | Wakabayashi | H03M 1/0658 |
| | | | | 348/302 |
| 2013/0015329 | A1 | 1/2013 | Iwaki | |
| 2013/0120622 | A1* | 5/2013 | Hiraoka | H04N 5/374 |
| | | | | 348/294 |
| 2015/0028190 | A1* | 1/2015 | Shin | H03K 21/38 |
| | | | | 250/208.1 |
| 2015/0042856 | A1* | 2/2015 | Nakamura | H04N 5/378 |
| | | | | 348/297 |
| 2015/0189214 | A1* | 7/2015 | Kurose | H01L 27/14634 |
| | | | | 250/208.1 |
| 2015/0326811 | A1* | 11/2015 | Nishida | H04N 5/378 |
| | | | | 348/308 |

(Continued)

FOREIGN PATENT DOCUMENTS

JP　2011-234326 A　11/2011

*Primary Examiner* — Shahbaz Nazrul
(74) *Attorney, Agent, or Firm* — ScienBiziP, P.C.

(57) ABSTRACT

[Object] To prevent code skipping in decoding.
[Solution] Included are a low-order bit latch unit (63) that latches digital code data as a low-order bit, a high-order bit counter unit (64) that counts one or both of edges of a control signal corresponding to a reference clock, and stops counting of high-order bits, triggered by output of a comparator (62) being inverted, a low-order bit decoding signal latch unit (65) that latches a low-order bit decoding signal, and a signal processing unit (8).

4 Claims, 15 Drawing Sheets

(56) References Cited

U.S. PATENT DOCUMENTS

| | | | |
|---|---|---|---|
| 2016/0182781 A1* | 6/2016 | Mabuchi | H04N 5/378 |
| | | | 348/322 |
| 2017/0237917 A1* | 8/2017 | Sato | H04N 5/3575 |
| | | | 348/308 |
| 2018/0041218 A1* | 2/2018 | Sato | H03M 1/08 |
| 2019/0082134 A1* | 3/2019 | Ushinaga | H04N 5/3765 |
| 2020/0053310 A1* | 2/2020 | Ushinaga | H04N 5/357 |

* cited by examiner

| AD CONVERSION OUTPUT | AT TIME OF AD CONVERSION OUTPUT FIRST TIME | AT TIME OF AD CONVERSION OUTPUT SECOND TIME | DIFFERENCE BETWEEN AD CONVERSIONS AT FIRST TIME AND SECOND TIME |
|---|---|---|---|
| LOW-ORDER BIT DECODING SIGNAL | GCODECR | GCODECS | — |
| SIGNAL OF LEAST SIGNIFICANT BIT AT HIGH-ORDER BIT COUNTER UNIT | BCOR[0] | BCOS[0] | BCOD[0] |

(b)

| GCODECR | BCOR[0] | CODE SKIPPING | CORRECTION |
|---|---|---|---|
| 0 | 0 | 0 | 0 |
| 0 | 1 | −32 | 32 |
| 1 | 0 | −32 | 32 |
| 1 | 1 | 0 | 0 |

(c)

| GCODECR | BCOR[0] | CODE SKIPPING | CORRECTION |
|---|---|---|---|
| 0 | 0 | −32 | 32 |
| 0 | 1 | 0 | 0 |
| 1 | 0 | 0 | 0 |
| 1 | 1 | −32 | 32 |

(d)

| GCODECS | BCOS[0] | CODE SKIPPING | CORRECTION |
|---|---|---|---|
| 0 | 0 | 0 | 0 |
| 0 | 1 | 32 | −32 |
| 1 | 0 | 32 | −32 |
| 1 | 1 | 0 | 0 |

GCODECR: LOW-ORDER BIT DECODING SIGNAL AT TIME OF AD CONVERSION OUTPUT FIRST TIME
GCODECS: LOW-ORDER BIT DECODING SIGNAL AT TIME OF AD CONVERSION OUTPUT SECOND TIME
BCOR[0]: LEAST SIGNIFICANT BIT OF HIGH-ORDER BIT COUNTER IN AD CONVERSION RESULTS FIRST TIME
BCOS[0]: LEAST SIGNIFICANT BIT OF HIGH-ORDER BIT COUNTER IN AD CONVERSION RESULTS SECOND TIME
BCOD[0]: LEAST SIGNIFICANT BIT OF HIGH-ORDER BIT COUNTER IN DIFFERENCE BETWEEN AD CONVERSION RESULTS FIRST TIME AND SECOND TIME

| AD CONVERSION OUTPUT | AT TIME OF AD CONVERSION OUTPUT FIRST TIME | AT TIME OF AD CONVERSION OUTPUT SECOND TIME | DIFFERENCE BETWEEN AD CONVERSIONS AT FIRST TIME AND SECOND TIME |
|---|---|---|---|
| LOW-ORDER BIT DECODING SIGNAL | GCODECR | GCODECS | — |
| SIGNAL OF LEAST SIGNIFICANT BIT AT HIGH-ORDER BIT COUNTER UNIT | BCOR[0] | BCOS[0] | BCOD[0] |

(b)

| GCODECR | BCOR[0] | CODE SKIPPING | CORRECTION |
|---|---|---|---|
| 0 | 0 | 0 | 0 |
| 0 | 1 | 32 | -32 |
| 1 | 0 | 32 | -32 |
| 1 | 1 | 0 | 0 |

(c)

| GCODECR | BCOR[0] | CODE SKIPPING | CORRECTION |
|---|---|---|---|
| 0 | 0 | 32 | -32 |
| 0 | 1 | 0 | 0 |
| 1 | 0 | 0 | 0 |
| 1 | 1 | 32 | -32 |

(d)

| GCODECS | BCOS[0] | CODE SKIPPING | CORRECTION |
|---|---|---|---|
| 0 | 0 | 0 | 0 |
| 0 | 1 | -32 | 32 |
| 1 | 0 | -32 | 32 |
| 1 | 1 | 0 | 0 |

GCODECR: LOW-ORDER BIT DECODING SIGNAL AT TIME OF AD CONVERSION OUTPUT FIRST TIME
GCODECS: LOW-ORDER BIT DECODING SIGNAL AT TIME OF AD CONVERSION OUTPUT SECOND TIME
BCOR [0]: LEAST SIGNIFICANT BIT OF HIGH-ORDER BIT COUNTER IN AD CONVERSION RESULTS FIRST TIME
BCOS [0]: LEAST SIGNIFICANT BIT OF HIGH-ORDER BIT COUNTER IN AD CONVERSION RESULTS SECOND TIME
BCOD [0]: LEAST SIGNIFICANT BIT OF HIGH-ORDER BIT COUNTER IN DIFFERENCE BETWEEN AD CONVERSION RESULTS FIRST TIME AND SECOND TIME

FIG. 9

| CNT | BINARY CODE | | | | GRAY CODE | | | | | | | | | | | | DEC. CODE EXPECTATION VALUE | DEC. CODE DETECTION VALUE | DIFFERENCE |
|---|---|---|---|---|---|---|---|---|---|---|---|---|---|---|---|---|---|---|---|
| | [12] | [11] | [10] | [9] | [8] | [7] | [6] | [5] | [4] | [3] | [2] | [1] | [0] | | | | | | |
| 0 | 0 | 0 | 0 | 0 | 0 | 0 | 0 | 0 | 0 | 0 | 0 | 0 | 0 | | | | 0 | 0 | 0 |
| 1 | 0 | 0 | 0 | 0 | 0 | 0 | 0 | 0 | 0 | 0 | 0 | 0 | 1 | | | | 1 | 1 | 0 |
| 2 | 0 | 0 | 0 | 0 | 0 | 0 | 0 | 0 | 0 | 0 | 0 | 1 | 1 | | | | 2 | 2 | 0 |
| 3 | 0 | 0 | 0 | 0 | 0 | 0 | 0 | 0 | 0 | 0 | 0 | 1 | 0 | | | | 3 | 3 | 0 |
| 4 | 0 | 0 | 0 | 0 | 0 | 0 | 0 | 0 | 0 | 0 | 1 | 1 | 0 | | | | 4 | 4 | 0 |
| 5 | 0 | 0 | 0 | 0 | 0 | 0 | 0 | 0 | 0 | 0 | 1 | 1 | 1 | | | | 5 | 5 | 0 |
| 6 | 0 | 0 | 0 | 0 | 0 | 0 | 0 | 0 | 0 | 0 | 1 | 0 | 1 | | | | 6 | 6 | 0 |
| 7 | 0 | 0 | 0 | 0 | 0 | 0 | 0 | 0 | 0 | 0 | 1 | 0 | 0 | | | | 7 | 7 | 0 |
| 8 | 0 | 0 | 0 | 0 | 0 | 0 | 0 | 0 | 0 | 1 | 1 | 0 | 0 | | | | 8 | 8 | 0 |
| 9 | 0 | 0 | 0 | 0 | 0 | 0 | 0 | 0 | 0 | 1 | 1 | 0 | 1 | | | | 9 | 9 | 0 |
| 10 | 0 | 0 | 0 | 0 | 0 | 0 | 0 | 0 | 0 | 1 | 1 | 1 | 1 | | | | 10 | 10 | 0 |
| 11 | 0 | 0 | 0 | 0 | 0 | 0 | 0 | 0 | 0 | 1 | 1 | 1 | 0 | | | | 11 | 11 | 0 |
| 12 | 0 | 0 | 0 | 0 | 0 | 0 | 0 | 0 | 0 | 1 | 0 | 1 | 0 | | | | 12 | 12 | 0 |
| 13 | 0 | 0 | 0 | 0 | 0 | 0 | 0 | 0 | 0 | 1 | 0 | 1 | 1 | | | | 13 | 13 | 0 |
| 14 | 0 | 0 | 0 | 0 | 0 | 0 | 0 | 0 | 0 | 1 | 0 | 0 | 1 | | | | 14 | 14 | 0 |
| 15 | 0 | 0 | 0 | 0 | 0 | 0 | 0 | 0 | 0 | 1 | 0 | 0 | 0 | | | | 15 | 15 | 0 |
| 16 | 0 | 0 | 0 | 0 | 0 | 0 | 0 | 0 | 1 | 1 | 0 | 0 | 0 | | | | 16 | 16 | 0 |
| 17 | 0 | 0 | 0 | 0 | 0 | 0 | 0 | 0 | 1 | 1 | 0 | 0 | 1 | | | | 17 | 17 | 0 |
| 18 | 0 | 0 | 0 | 0 | 0 | 0 | 0 | 0 | 1 | 1 | 0 | 1 | 1 | | | | 18 | 18 | 0 |
| 19 | 0 | 0 | 0 | 0 | 0 | 0 | 0 | 0 | 1 | 1 | 0 | 1 | 0 | | | | 19 | 19 | 0 |
| 20 | 0 | 0 | 0 | 0 | 0 | 0 | 0 | 0 | 1 | 1 | 1 | 1 | 0 | | | | 20 | 20 | 0 |
| 21 | 0 | 0 | 0 | 0 | 0 | 0 | 0 | 0 | 1 | 1 | 1 | 1 | 1 | | | | 21 | 21 | 0 |
| 22 | 0 | 0 | 0 | 0 | 0 | 0 | 0 | 0 | 1 | 1 | 1 | 0 | 1 | | | | 22 | 22 | 0 |
| 23 | 0 | 0 | 0 | 0 | 0 | 0 | 0 | 0 | 1 | 1 | 1 | 0 | 0 | | | | 23 | 23 | 0 |
| 24 | 0 | 0 | 0 | 0 | 0 | 0 | 0 | 0 | 1 | 0 | 1 | 0 | 0 | | | | 24 | 24 | 0 |
| 25 | 0 | 0 | 0 | 0 | 0 | 0 | 0 | 0 | 1 | 0 | 1 | 0 | 1 | | | | 25 | 25 | 0 |
| 26 | 0 | 0 | 0 | 0 | 0 | 0 | 0 | 0 | 1 | 0 | 1 | 1 | 1 | | | | 26 | 26 | 0 |
| 27 | 0 | 0 | 0 | 0 | 0 | 0 | 0 | 0 | 1 | 0 | 1 | 1 | 0 | | | | 27 | 27 | 0 |
| 28 | 0 | 0 | 0 | 0 | 0 | 0 | 0 | 0 | 1 | 0 | 0 | 1 | 0 | | | | 28 | 28 | 0 |
| 29 | 0 | 0 | 0 | 0 | 0 | 0 | 0 | 0 | 1 | 0 | 0 | 1 | 1 | | | | 29 | 29 | 0 |
| 30 | 0 | 0 | 0 | 0 | 0 | 0 | 0 | 0 | 1 | 0 | 0 | 0 | 1 | | | | 30 | 30 | 0 |
| 31 | 0 | 0 | 0 | 0 | 0 | 0 | 0 | 0 | 1 | 0 | 0 | 0 | 0 | ←ADJUSTMENT | | | 31 | 31 | 0 |
| 32 | 0 | 0 | 0 | 0 | 0 | 0 | 0 | 1 | 1 | 0 | 0 | 0 | 0 | | | | 32 | 32 | 0 |
| 33 | 0 | 0 | 0 | 0 | 0 | 0 | 0 | 1 | 1 | 0 | 0 | 0 | 1 | | | | 33 | 33 | 0 |
| 34 | 0 | 0 | 0 | 0 | 0 | 0 | 0 | 1 | 1 | 0 | 0 | 1 | 1 | | | | 34 | 34 | 0 |
| 35 | 0 | 0 | 0 | 0 | 0 | 0 | 0 | 1 | 1 | 0 | 0 | 1 | 0 | | | | 35 | 35 | 0 |
| 36 | 0 | 0 | 0 | 0 | 0 | 0 | 0 | 1 | 1 | 0 | 1 | 1 | 0 | | | | 36 | 36 | 0 |
| 37 | 0 | 0 | 0 | 0 | 0 | 0 | 0 | 1 | 1 | 0 | 1 | 1 | 1 | | | | 37 | 37 | 0 |
| 38 | 0 | 0 | 0 | 0 | 0 | 0 | 0 | 1 | 1 | 0 | 1 | 0 | 1 | | | | 38 | 38 | 0 |
| 39 | 0 | 0 | 0 | 0 | 0 | 0 | 0 | 1 | 1 | 0 | 1 | 0 | 0 | | | | 39 | 39 | 0 |
| 40 | 0 | 0 | 0 | 0 | 0 | 0 | 0 | 1 | 1 | 1 | 1 | 0 | 0 | | | | 40 | 40 | 0 |
| 41 | 0 | 0 | 0 | 0 | 0 | 0 | 0 | 1 | 1 | 1 | 1 | 0 | 1 | | | | 41 | 41 | 0 |
| 42 | 0 | 0 | 0 | 0 | 0 | 0 | 0 | 1 | 1 | 1 | 1 | 1 | 1 | | | | 42 | 42 | 0 |
| 43 | 0 | 0 | 0 | 0 | 0 | 0 | 0 | 1 | 1 | 1 | 1 | 1 | 0 | | | | 43 | 43 | 0 |
| 44 | 0 | 0 | 0 | 0 | 0 | 0 | 0 | 1 | 1 | 1 | 0 | 1 | 0 | | | | 44 | 44 | 0 |
| 45 | 0 | 0 | 0 | 0 | 0 | 0 | 0 | 1 | 1 | 1 | 0 | 1 | 1 | | | | 45 | 45 | 0 |
| 46 | 0 | 0 | 0 | 0 | 0 | 0 | 0 | 1 | 1 | 1 | 0 | 0 | 1 | | | | 46 | 46 | 0 |
| 47 | 0 | 0 | 0 | 0 | 0 | 0 | 0 | 1 | 1 | 1 | 0 | 0 | 0 | | | | 47 | 47 | 0 |
| 48 | 0 | 0 | 0 | 0 | 0 | 0 | 0 | 1 | 0 | 1 | 0 | 0 | 0 | | | | 48 | 48 | 0 |
| 49 | 0 | 0 | 0 | 0 | 0 | 0 | 0 | 1 | 0 | 1 | 0 | 0 | 1 | | | | 49 | 49 | 0 |
| 50 | 0 | 0 | 0 | 0 | 0 | 0 | 0 | 1 | 0 | 1 | 0 | 1 | 1 | | | | 50 | 50 | 0 |
| 51 | 0 | 0 | 0 | 0 | 0 | 0 | 0 | 1 | 0 | 1 | 0 | 1 | 0 | | | | 51 | 51 | 0 |
| 52 | 0 | 0 | 0 | 0 | 0 | 0 | 0 | 1 | 0 | 1 | 1 | 1 | 0 | | | | 52 | 52 | 0 |
| 53 | 0 | 0 | 0 | 0 | 0 | 0 | 0 | 1 | 0 | 1 | 1 | 1 | 1 | | | | 53 | 53 | 0 |
| 54 | 0 | 0 | 0 | 0 | 0 | 0 | 0 | 1 | 0 | 1 | 1 | 0 | 1 | | | | 54 | 54 | 0 |
| 55 | 0 | 0 | 0 | 0 | 0 | 0 | 0 | 1 | 0 | 1 | 1 | 0 | 0 | | | | 55 | 55 | 0 |
| 56 | 0 | 0 | 0 | 0 | 0 | 0 | 0 | 1 | 0 | 0 | 1 | 0 | 0 | | | | 56 | 56 | 0 |
| 57 | 0 | 0 | 0 | 0 | 0 | 0 | 0 | 1 | 0 | 0 | 1 | 0 | 1 | | | | 57 | 57 | 0 |
| 58 | 0 | 0 | 0 | 0 | 0 | 0 | 0 | 1 | 0 | 0 | 1 | 1 | 1 | | | | 58 | 58 | 0 |
| 59 | 0 | 0 | 0 | 0 | 0 | 0 | 0 | 1 | 0 | 0 | 1 | 1 | 0 | | | | 59 | 59 | 0 |
| 60 | 0 | 0 | 0 | 0 | 0 | 0 | 0 | 1 | 0 | 0 | 0 | 1 | 0 | | | | 60 | 60 | 0 |
| 61 | 0 | 0 | 0 | 0 | 0 | 0 | 0 | 1 | 0 | 0 | 0 | 1 | 1 | | | | 61 | 61 | 0 |
| 62 | 0 | 0 | 0 | 0 | 0 | 0 | 0 | 1 | 0 | 0 | 0 | 0 | 1 | | | | 62 | 62 | 0 |
| 63 | 0 | 0 | 0 | 0 | 0 | 0 | 0 | 1 | 0 | 0 | 0 | 0 | 0 | | | | 63 | 63 | 0 |

ANALOG-TO-DIGITAL CONVERTER AND SOLID-STATE IMAGE SENSOR

TECHNICAL FIELD

The present invention relates to an analog-to-digital converter that can be included in a solid-state image sensor such as a CMOS image sensor or the like, and a solid-state image sensor having the same.

BACKGROUND ART

A conventional CMOS image sensor has a floating diffusion layer and amplifier for each of pixels disposed in a matrix form. Column-parallel output types, where the output of the CMOS image sensor is obtained by selecting one row in the layout of pixels and reading these out in the column direction at the same time, are mainstream. Output read out in the column direction is converted into digital signals at an analog-to-digital converter at each column.

Various configurations have been conventionally proposed regarding analog-to-digital converters included in column-parallel output type CMOS image sensors. Of these, analog-to-digital converters that have a configuration where analog-to-digital conversion is performed on each of the two data pieces of initial state and after signal accumulation, and subtraction processing (digital CDS) of each of these is performed, thereby realizing low-noise characteristics, are mainstream. For example, PTL 1 discloses a technique where optimization of consumed current and circuit area are promoted by changing circuit configurations for high-order bits and low-order bits.

FIG. 15 is a block diagram illustrating a configuration example of a solid-state image sensor 101 in which conventional analog-to-digital converters disclosed in PTL 1 are included. The solid-state image sensor 101 includes a pixel portion 102, a row selecting circuit 103, a reference voltage generating unit 104, a counter generating unit 105, an analog-to-digital converter unit (ADC unit) 106, a column selecting circuit 107, and a signal processing unit 108, as illustrated in the drawing. The pixel portion 102 has multiple unit pixels 121. The ADC unit 106 has multiple analog-to-digital converters (ADCs) 161. Each ADC 161 has a comparator 162, a low-order bit latch unit 163, and a high-order bit counter unit 164.

The row selecting circuit 103 selects one row worth of unit pixels 121 out of the multiple rows within the pixel portion 2. The one row worth of unit pixels 121 that has been selected converts incident light into analog signals, and transfers the analog signals to the corresponding ADC unit 106 via corresponding vertical signal lines 122.

The reference voltage generating unit 104 generates reference voltage that varies based on a reference clock. The comparator 162 compares the input analog signal voltage with the reference voltage, and inverts the output signal at the point that the reference voltage exceeds the analog signal voltage. The counter generating unit 105 generates counter data 151. The low-order bit latch unit 163 latches the counter data 151, triggered at the point of the output signal of the comparator 162 being inverted. The low-order bit latch unit 163 generates a carry signal 165. The high-order bit counter unit 164 counts high-order bits in response to the carry signal 165.

Thus, the conventional solid-state image sensor 101 illustrated in FIG. 15 does not count low-order bits where there is a great amount of data transition, and latches counter data 151 generated by the count generating unit 105. This enables low-consumption current to be realized. Further, binary counting of high-order bits enables the circuit scale of the solid-state image sensor 101 to be reduced, since subtraction processing can be immediately performed.

CITATION LIST

Patent Literature

[PTL 1] Japanese Unexamined Patent Application Publication No. 2011-234326 (published on Nov. 17, 2011)

SUMMARY OF INVENTION

Technical Problem

However, in the above-described conventional art, there is difference in delay time from a counter stop signal being input until the counter actually stops and data is finalized, due to difference in circuit configuration between the high-order bit counter and low-order bit counter, difference in layout positioning, and so forth. Accordingly, there has been a problem that, in a case where a counter stop signal is input at a borderline timing of an occurrence of carrying from a low-order bit to a high-order bit, there is difference occurring between the high-order bit and low-order bit, and code skipping occurs in decoding.

An aspect of the present invention has been made in light of the above-described problem, and accordingly it is an object thereof to realize an analog-to-digital converter and so forth by which code skipping in decoding can be prevented.

Solution to Problem (1) An analog-to-digital converter according an embodiment of the present invention is disposed for at least one column or at least one of unit pixels, and converts input analog signals into digital signals. The analog-to-digital converter includes: a comparator that compares voltage of the analog signals with a reference voltage of which a voltage value varies in accordance with a reference clock; a low-order bit latch unit that latches digital code data corresponding to the reference clock as a low-order bit, triggered by output of the comparator being inverted; and a high-order bit counter unit that counts one or both of edges of a control signal corresponding to the reference clock, and stops counting of high-order bits, triggered by output of the comparator being inverted, the analog-to-digital converter including: a low-order bit decoding signal latch unit that latches a low-order bit decoding signal corresponding to the reference clock; and a signal processing unit that compares a value of the low-order bit decoding signal that has been latched and a value of a least significant bit of the high-order bits to detect code skipping, and corrects the detected code skipping.

(2) Also, in the analog-to-digital converter according to an embodiment of the present invention, in addition to the configuration of (1) above, the signal processing unit detects the code skipping in a case where the value of the low-order bit decoding signal and the value of the least significant bit differ, and corrects the detected code skipping.

(3) Also, in the analog-to-digital converter according to an embodiment of the present invention, in addition to the configuration of (1) above, the signal processing unit detects the code skipping in a case where the value of the low-order bit decoding signal and the value of the least significant bit are equal, and corrects the detected code skipping.

(4) Also, a solid-state image sensor according to an embodiment of the present invention includes: a pixel portion that converts incident light into analog signals; the analog-to-digital converter according to any one of (1) through (3) above, that converts the analog signals into digital signals; and a vertical signal line for transferring the analog signals from the pixel portion to the analog-to-digital converter.

Advantageous Effects of Invention

According to an aspect of the present invention, an advantage is yielded in that code skipping in decoding can be prevented.

BRIEF DESCRIPTION OF DRAWINGS

FIG. 4 is a diagram relating to the analog-to-digital converter, for describing a specific method for correcting code skipping.

FIG. 8 is a diagram relating to the analog-to-digital converter, for describing a specific method for correcting code skipping.

FIG. 9 is a table indicating, in a case where delay does not occur at a high-order bit counter and low-order bit counter, an example of (i) transition of decoding expectation values, (ii) transition of decoding theoretical values, and (iii) transition of difference between decoding expectation values and decoding theoretical values.

FIG. 11 is a table indicating, in a case where a high-order bit counter is delayed as to a low-order bit counter, an example of (i) transition of decoding expectation values, (ii) transition of decoding theoretical values, and (iii) transition of difference between decoding expectation values and decoding theoretical values.

FIG. 13 is a table indicating, in a case where a low-order bit counter is delayed as to a high-order bit counter, an example of (i) transition of decoding expectation values, (ii) transition of decoding theoretical values, and (iii) transition of difference between decoding expectation values and decoding theoretical values.

DESCRIPTION OF EMBODIMENTS

Embodiment 1

Description will be made below regarding an overview of an analog-to-digital converter that prevents code skipping in decoding, according to an embodiment of the present invention, with reference to FIG. 1 through FIG. 6 and FIG. 9 through FIG. 12. Note that a digital CDS type analog-to-digital converter will be used as an example for description of the analog-to-digital converter according to the present invention. However, the example is not restricted to a digital CDS type analog-to-digital converter, and an analog-to-digital converter can be applied without restrictions as long as the analog-to-digital converter that has a high-order bit counter and low-order bit counter. Note that a case where the high-order bit counter displays binary data will be described.

[Configuration of Solid-State Image Sensor 1]

Figure 1:
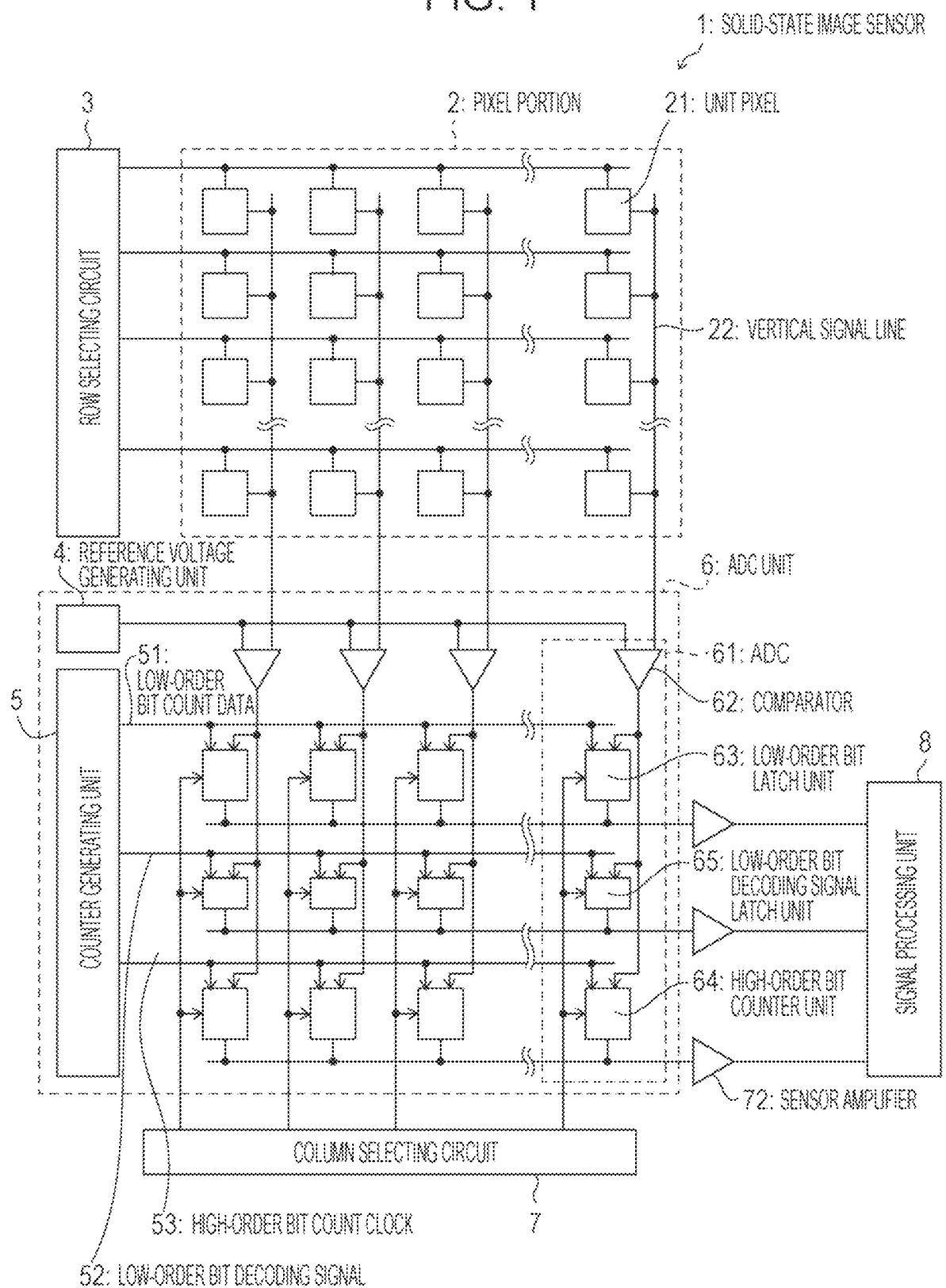
FIG. 1 is a block diagram illustrating a configuration example of a solid-state image sensor in which an analog-to-digital converter according to an embodiment of the present invention is included.

FIG. 1 is a block diagram illustrating a configuration example of a solid-state image sensor 1 in which an analog-to-digital converter according to an embodiment of the present invention is included. The solid-state image sensor 1 includes a pixel portion 2, a row selecting circuit 3, a reference voltage generating unit 4, a counter generating unit 5, an analog-to-digital converter unit (hereinafter also referred to as ADC unit) 6, a column selecting circuit 7, a sensor amplifier 72, and a signal processing unit 8, as illustrated in the drawing. The pixel portion 2 has multiple unit pixels 21 disposed in a matrix form.

The row selecting circuit 3 outputs a selection signal to the pixel portion 2, to select one row worth of unit pixels. The unit pixels 21 to which the selection signal has been input each convert incident light into analog signals, and transfer the analog signals to the corresponding later-described ADC unit 6 via corresponding vertical signal lines 22.

The reference voltage generating unit 4 is a type of digital-to-analog converter, and generates electric current of which the voltage value changes based on a reference clock.

The count generating unit 5 is disposed corresponding to later-described ADCs 61. The count generating unit 5 generates digital code for a low-order bit counter described later, digital code for a high-order bit counter described later, and a clock that controls the high-order bit counter, each of which corresponds to the reference clock, and outputs these to a later-described low-order bit latch unit 63, high-order bit counter unit 64, and low-order bit decoding signal latch unit 65.

Note that the low-order bit counter in the present embodiment is a counter that counts bits from the least significant bit to a particular bit in the count data that has been input, and there is no restriction regarding the number of bits to be counted. Also, the high-order bit counter in the present embodiment is a counter that counts bits, which are not counted by the low-order bit counter, in the count data that has been input. Specifically, in a case where the input count data is 13 bits, and five bits from the least significant bit have been counted by the low-order bit counter, the high-order bit counter is a counter that counts the remaining eight bits.

(ADC Unit)

The ADC unit 6 has multiple analog-to-digital converters (ADCs) 61. Each ADC 61 has a comparator 62, low-order bit latch unit 63, high-order bit counter unit 64, and low-order bit decoding signal latch unit 65.

The ADCs 61 each convert input analog signals into digital signals, and transmits the respective outputs of the low-order bit latch unit 63, high-order bit counter unit 64, and low-order bit decoding signal latch unit 65 to the signal processing unit 8. In the solid-state image sensor 1 illustrated in FIG. 1, one ADC 61 is disposed for each column in the pixel portion 2.

However, the ADCs 61 are not restricted to being disposed in this way. One ADC 61 may be disposed for at least one column or at least one of unit pixels 21. In other words, one ADC 61 may be disposed for one unit pixel 21 or for a plurality of unit pixels 21, and multiple unit pixels 21 corresponding to each ADC 61 may be a combination of any number of unit pixels 21 selected from all unit pixels 21.

The comparator 62 compares the input analog signal voltage with the reference voltage, and inverts the output signal at the point that the reference voltage exceeds the analog signal voltage. The low-order bit latch unit 63 latches, as a low-order bit, digital data corresponding to low-order bits in the counter data, triggered at the point of the output of the comparator 62 being inverted. The low-order bit decoding signal latch unit 65 latches, as a low-order bit decoding signal, the clock signal inverted at the same timing as the least significant bit of the high-order bit counter, triggered at the point of the output of the comparator 62 being inverted. The high-order bit counter unit 64 counts one or both of edges of a high-order bit counter clock (CNT signal; control signal) 53, and stops counting the high-order bit counter clock, triggered by the output of the comparator 62 being inverted.

The column selecting circuit 7 selects one of the unit pixels 21 included in one of the multiple columns. The signal processing unit 8 performs signal processing on data transferred to the signal processing unit 8 via a horizontal signal line. In the example illustrated in FIG. 1, the column selecting circuit 7 is a circuit that selects at least one ADC 61. It is assumed that one ADC 61 is disposed for each unit pixel 21, a pixel selecting circuit that selects individual single unit pixel 21 is provided instead of the column selecting circuit 7.

[Overview of Operations of Digital CDS Type Analog-to-Digital Converter]

Figure 2:
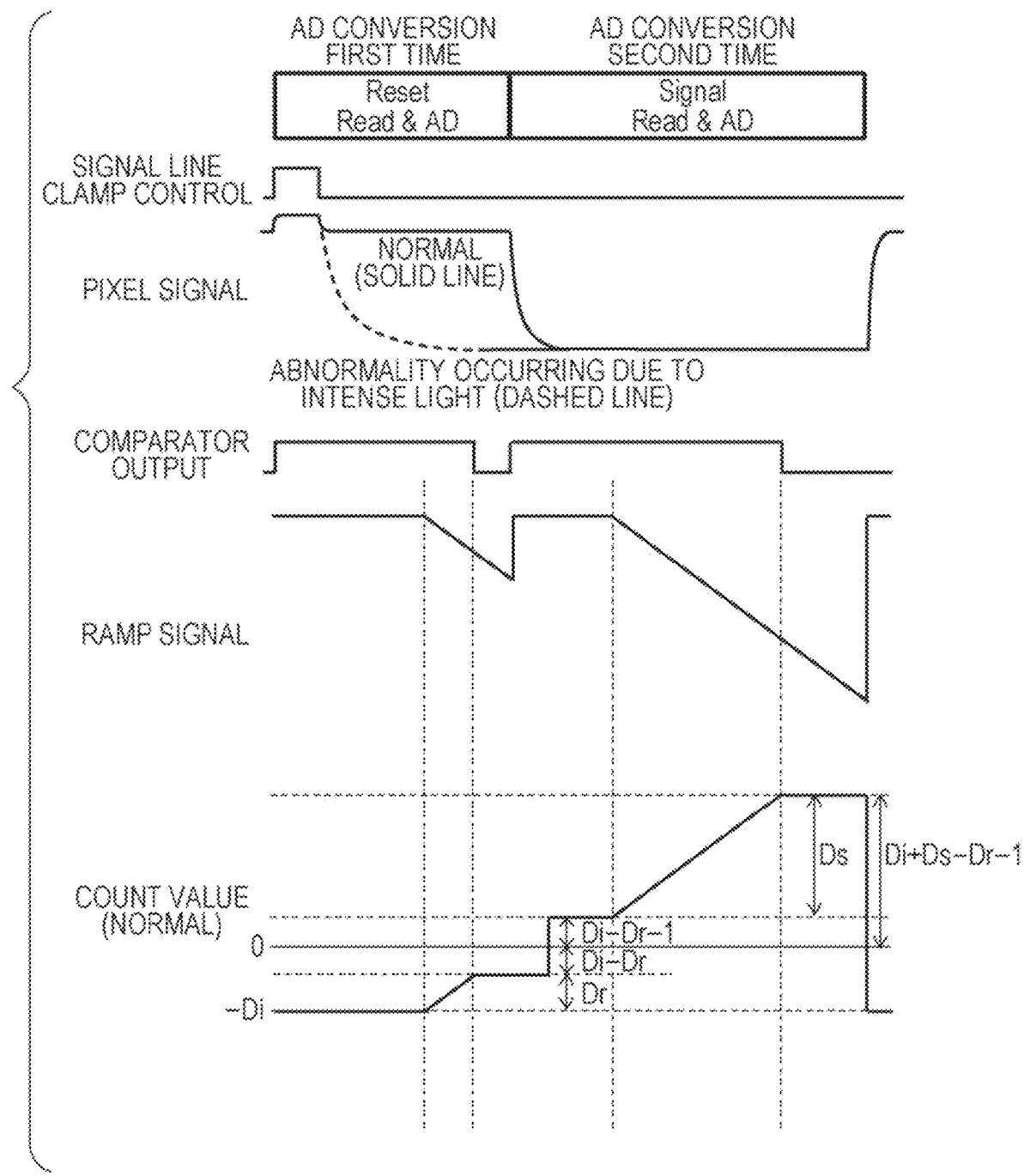
FIG. 2 is a diagram for describing an overview of operations of the analog-to-digital converter.

An overview of operations of a digital CDS type analog-to-digital converter will be described with reference to FIG. 2. The ADC 61 performs analog-to-digital conversion (analog-to-digital conversion is also referred to as AD conversion) twice. In the first analog-to-digital conversion, data of the initial state is subjected to analog-to-digital conversion. This operation will be referred to as Reset Read & AD. Also, in the second analog-to-digital conversion, data following signal accumulation is subjected to analog-to-digital conversion. This operation will be referred to as Signal Read & AD.

Specifically, description of analog-to-digital conversion is as follows. First, a signal for clamp control of a signal line is output, triggered by the inverted output of the comparator 62 being reinverted (in other words, the comparator 62 outputs a signal that is not inverted). Accordingly, a pixel signal is subjected to analog-to-digital conversion. The number and so forth of data generated at the reference voltage generating unit 4 from the pixel signal having been subjected to analog-to-digital conversion is then counted. Thereafter, counting is stopped, triggered by the output of the comparator 62 being inverted.

Next, the second analog-to-digital conversion is performed, triggered by the inverted output of the comparator 62 being reinverted. Note that the second analog-to-digital conversion can be performed in the same way as the first analog-to-digital conversion.

The value counted in this way is "Di+Ds−Dr−1", where Di is the value before starting counting, Dr is the value by which the count has increased at the time of performing the first analog-to-digital conversion, and Ds is the value by which the count has increased at the time of performing the second analog-to-digital conversion.

[Code Skipping Determination Method]

Figure 3:
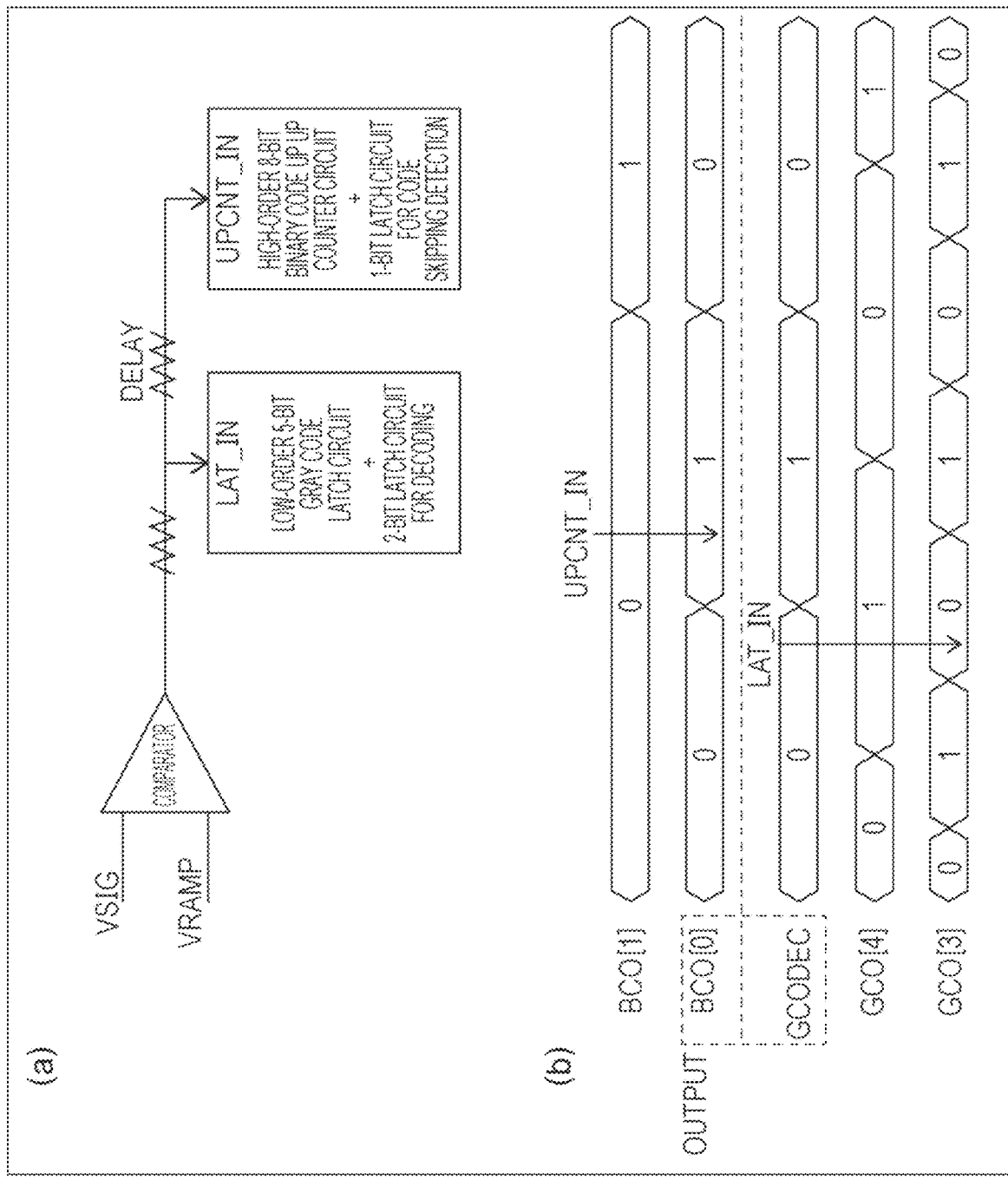
FIG. 3(a) is a schematic diagram illustrating the flow of processing of the analog-to-digital converter according to Embodiment 1 of the present invention, and (b) is a diagram for describing a specific method for determining code skipping in (a).

Next, a code skipping determination method at the ADC 61 having a hybrid counter configuration configured of a high-order bit counter and low-order bit counter will be described with reference to (a) in FIG. 3 and (b) in FIG. 3. (a) in FIG. 3 is a schematic diagram illustrating the flow of processing at the ADC 61 having a 13-bit hybrid counter configuration configured of an 8-bit high-order bit counter and a 5-bit low-order bit counter according to Embodiment 1 of the present invention. (b) in FIG. 3 is a diagram illustrating a specific example of code skipping determination.

The low-order bit counter has the low-order bit latch unit 63 that latches five bits from the least significant bit, as illustrated in (a) in FIG. 3. The low-order bit counter displays Gray code (digital code). Further, at the time of the low-order bit latch unit 63 latching the low-order bit counter, the low-order bit decoding signal latch unit 65 latches the clock signal that inverts at the same timing as the least significant bit of the high-order bit counter, as a low-order bit decoding signal. Note that an arrangement may be made where the entire high-order bit counter is latched, instead of just latching the least significant bit.

The high-order bit counter has the high-order bit counter unit 64 that counts the eight bits not latched or the like by the low-order bit counter using an UP UP counter circuit. The high-order bit counter displays binary code (digital code). Note that the high-order bit counter may have a latch circuit that latches the least significant bit at the time of a signal being conveyed to stop the count data.

Also, the numbers of bits at the high-order bit counter and the low-order bit counter are not restricted in particular, and the numbers of bits at each of the high-order bit counter and the low-order bit counter may be optionally changed.

Figure 10:
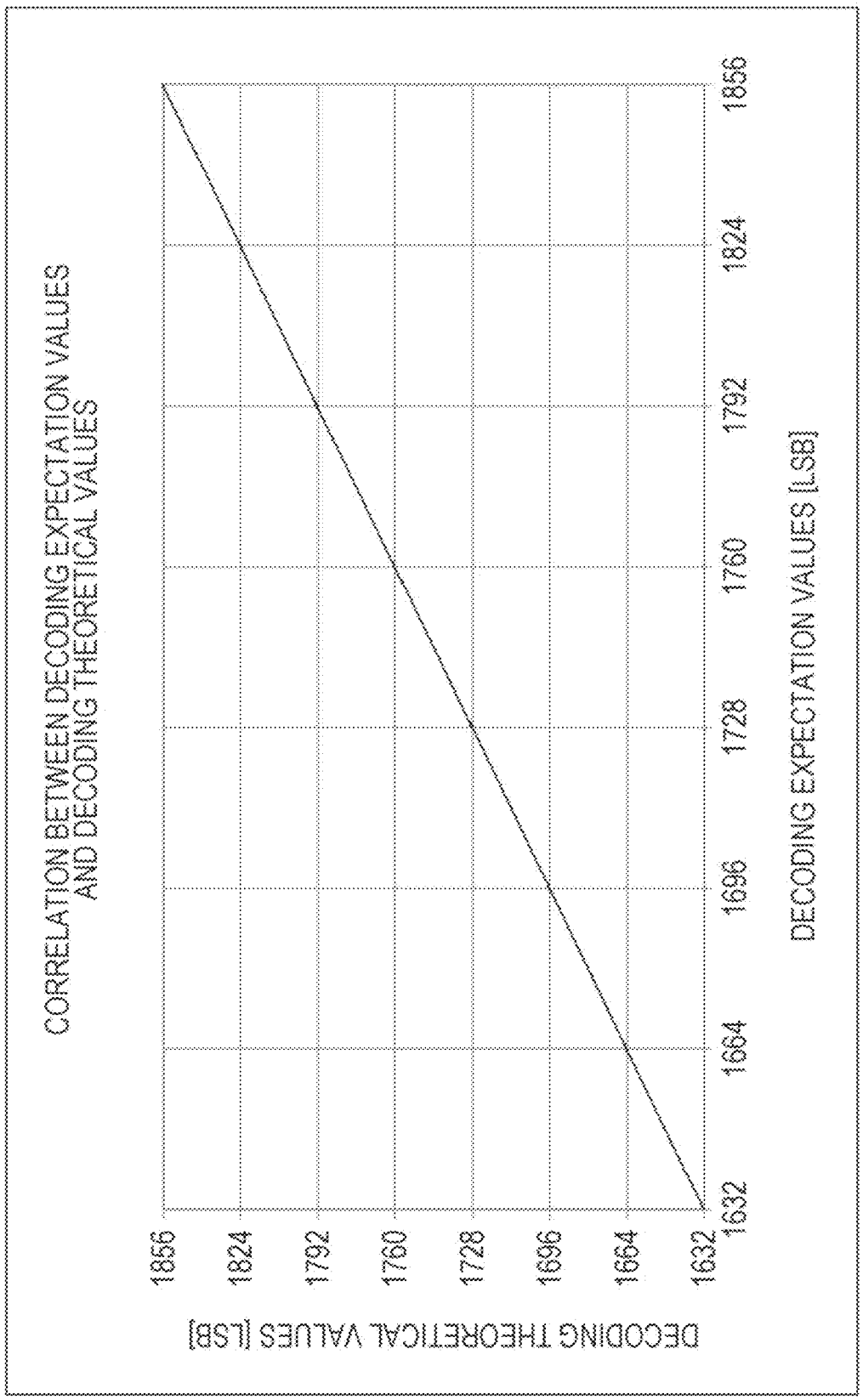
FIG. 10 is a graph illustrating the relation between decoding expectation values and decoding theoretical values in FIG. 9.

In a case where the stop signal emitted from the comparator is conveyed to the low-order bit counter and the high-order bit counter at the same time, there is no difference occurring between decoding expectation value and decoding theoretical value, as illustrated in FIG. 9 and FIG. 10. However, in a case where the stop signal emitted from the comparator is conveyed to the high-order bit counter after having been conveyed to the low-order bit counter, the timing at which the stop signal is conveyed to the high-order bit counter is later in comparison with the low-order bit counter, as illustrated in (a) in FIG. 3.

Further, there is difference in delay time from the stop signal having been conveyed until data is finalized, due to difference in configuration between the low-order bit counter and high-order bit counter. Note that the decoding expectation value indicates a count value before analog-to-digital conversion, and the decoding theoretical value indicates a count value after analog-to-digital conversion. The difference between decoding expectation value and decoding theoretical value (referred to simply as "difference" in the drawings) indicates a value where the decoding expectation value has been subtracted from the decoding theoretical value.

With a hybrid counter configuration where a low-order bit counter and high-order bit counter have been combined as described above, there is concern that code skipping may occur by different count data being selected between the low-order bit counter and high-order bit counter, due to difference in time required for signals to be conveyed and time required for processing to end.

Accordingly, whether or not there has been code skipping occurring can be determined by comparing the low-order bit decoding signal latched by the low-order bit decoding signal latch unit 65 and the least significant bit of data counted by the high-order bit counter unit 64.

Specific determination of whether or not there has been occurrence of code skipping will be described with reference to (b) in FIG. 3. Of the five bits displayed at the low-order bit counter, the most significant bit is written as GCO[4], and the bit one below the above-described the most significant bit is written as GCO[3]. A signal where the clock signal to be inverted at the same timing as the least significant bit of the high-order bit counter has been latched as a low-order bit decoding signal is written as GCODEC.

Also, of the bits displayed at the high-order bit counter, the least significant bit is written as BCO[0], and the bit one above the above-described least significant bit is written as BCO[1]. A case will be considered where a signal to stop counting (corresponds to "LAT_IN at the low-order bit counter, and corresponds to "UPCNT_IN at the high-order bit counter) is conveyed to the high-order bit counter and low-order bit counter. Note that the above-described signal to stop counting is a latch signal at a latch circuit, and is a count stop signal at an UP UP counter circuit.

Difference occurs in timing at which count data is finalized between the low-order bit counter and high-order bit counter, as illustrated in (b) in FIG. 3.

The count data of (GCODEC, GCO[4], GCO[3]) at the time of a signal to stop counting is conveyed to the low-order bit counter is (0, 1, 0). Accordingly, the count data latched by the low-order bit latch unit 63 is (1, 0), and the count data latched by the low-order bit decoding signal latch unit 65 is (0).

However, in (b) in FIG. 3, a signal for the next count data is conveyed by the time the signal to stop counting is conveyed to the high-order bit counter, and therefore the count data of (BCO[1], BCO[0]) is (0, 1). Accordingly, the count data of the least significant bit at the high-order bit counter unit 64 is (1).

Signals to stop counting are emitted at the same timing for both the high-order bit counter and low-order bit counter, and thus there is supposed to be no difference occurring between the value of the low-order bit decoding signal latched by the low-order bit decoding signal latch unit 65 and the value of the least significant bit at the high-order bit counter unit 64. However, in a case where the count data pieces stored at the high-order bit counter and low-order bit counter differ as described above, difference occurs between the value of the low-order bit decoding signal latched by the low-order bit decoding signal latch unit 65 and the value of the least significant bit at the high-order bit counter unit 64. Accordingly, whether or not there is code skipping can be determined by comparing the value of the low-order bit decoding signal latched by the low-order bit decoding signal latch unit 65 and the value of the least significant bit at the high-order bit counter unit 64.

[Code Skipping Detection Method]

Conditions for detecting code skipping at the ADC 61 according to the present embodiment change depending on the initial value of the least significant bit at the high-order bit counter unit 64.

In a case where the initial value of the least significant bit of the high-order bit counter unit 64 is "0", counting of the value of the least significant bit at the high-order bit counter unit 64 and the value of the low-order bit decoding signal latched by the low-order bit decoding signal latch unit 65 both start from "0". Accordingly, the value of the least significant bit at the high-order bit counter unit 64 and the value of the low-order bit decoding signal latched by the low-order bit decoding signal latch unit 65 are compared, and if different, this represents that code skipping has occurred.

On the other hand, in a case where the initial value of the least significant bit of the high-order bit counter unit 64 is "1", counting by the high-order bit counter unit 64 starts from "1". However, counting of the value of the low-order bit decoding signal latched by the low-order bit decoding signal latch unit 65 starts from "0". Accordingly, the value of the least significant bit at the high-order bit counter unit 64 and the value of the low-order bit decoding signal latched by the low-order bit decoding signal latch unit 65 are compared, and if the same, this represents that code skipping has occurred.

To summarize the above, in a case where the initial value of the least significant bit of the high-order bit counter unit 64 is "0", the value of the low-order bit decoding signal latched by the low-order bit decoding signal latch unit 65 and the value of the least significant bit at the high-order bit counter unit 64 are compared, and a case where the values are different can be detected as code skipping.

Also, in a case where the initial value of the least significant bit of the high-order bit counter unit 64 is "1", the value of the low-order bit decoding signal latched by the low-order bit decoding signal latch unit 65 and the value of the least significant bit at the high-order bit counter unit 64 are compared, and a case where the values are the same can be detected as code skipping. The detected code skipping can then be corrected by the following method.

In this way, code skipping can be detected without fail by comparing the value of the low-order bit decoding signal latched by the low-order bit decoding signal latch unit 65 and the value of the least significant bit at the high-order bit counter unit 64.

[Code Skipping Correction Method]

Figure 11:
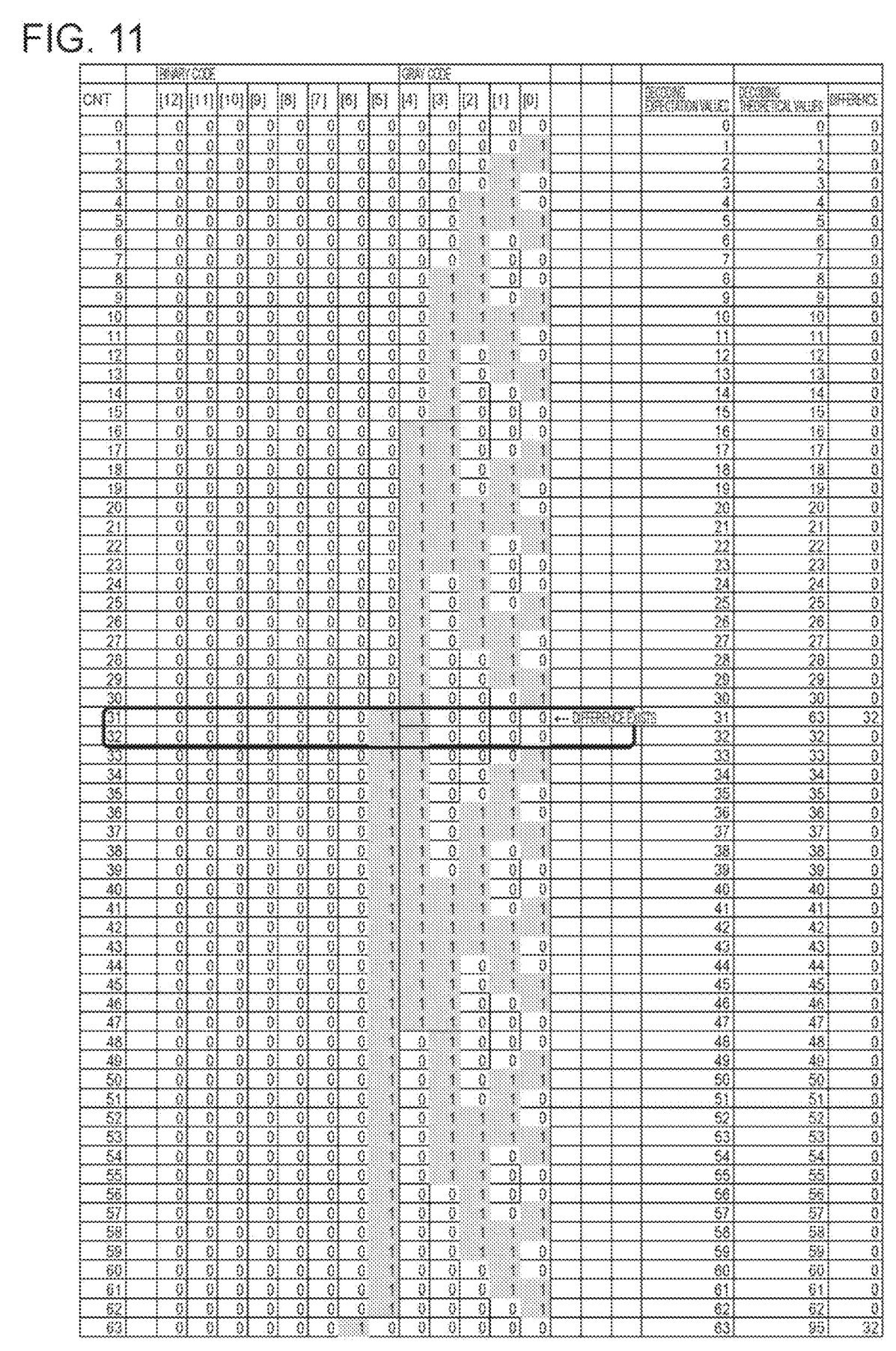
Figure 12:
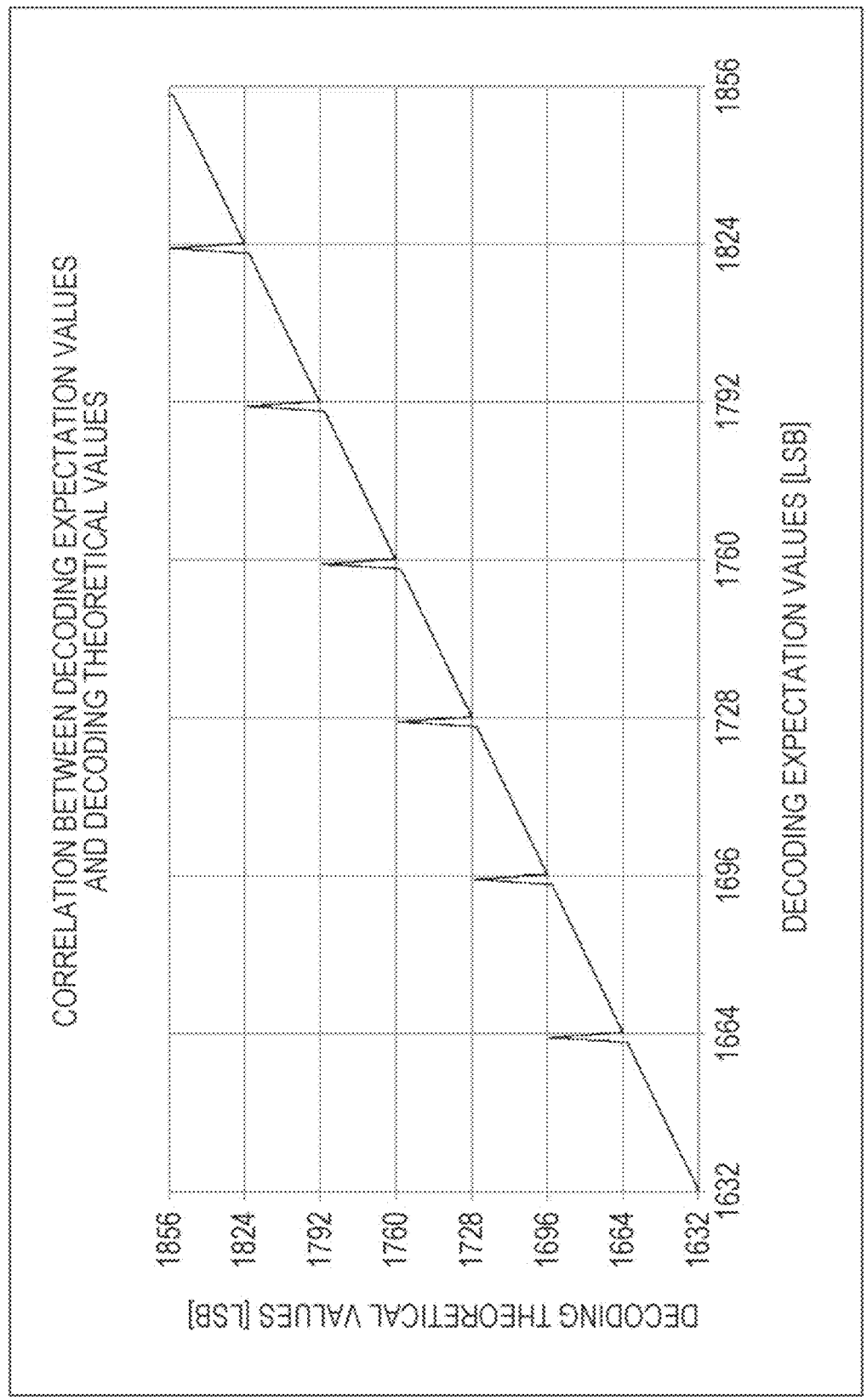
FIG. 12 is a graph illustrating the relation between decoding expectation values and decoding theoretical values in the table in FIG. 11.

The following is a correction method for code skipping at the ADC 61 according to the present embodiment. In the count value where code skipping has occurred at the ADC 61, where the high-order bit counter has stopped later than the low-order bit counter, an amount equivalent to 2 to the low-order bit'th power is added to the actual count value, as illustrated in FIGS. 11 and 12. Accordingly, in a case where code skipping has been detected, this can be corrected by subtracting an amount equivalent to 2 to the low-order bit'th power.

Now, a specific correction method of code skipping at the digital CDS type ADC 61 in a case where the number of bits for low-order bits is five bits will be described below, with reference to (b) through (d) in FIG. 4. (b) in FIG. 4 illustrates correction values for code skipping in a case where the least significant bit=0 for the initial value of the UP UP counter in a case of performing Reset Read & AD. (c) in FIG. 4 illustrates correction values for code skipping in a case where the least significant bit=1 for the initial value of the UP UP counter in a case of performing Reset Read & AD. (d) in FIG. 4 illustrates correction values for code skipping in a case of performing Signal Read & AD.

First, the signals illustrated in (b) through (d) in FIG. 4 will be described with reference to (a) in FIG. 4. A signal latched at the time of analog-to-digital conversion output the first time for a low-order bit decoding signal will be written as "GCODECR", and a signal latched at the time of analog-to-digital conversion output the second time will be written as "GCODECS". A signal of the least significant bit at the high-order bit counter unit 64 in the analog-to-digital conversion output the first time will be written as "BCOR[0]", and a signal of the least significant bit at the high-order bit counter unit 64 in the analog-to-digital conversion output the second time will be written as "BCOS[0]". Further, the difference between the first analog-to-digital conversion and the second analog-to-digital conversion for the signal of the least significant bit at the high-order bit counter unit 64 will be written as "BCOD[0]".

Of the above-described signals, signals output for detection of code skipping are "GCODECR", "GCODCS", "BCOR[0]", and "BCOD[0]". In actual operations, BCOS[0] is not directly output. However, BCOS[0] is calculated from the XNOR (negation of exclusive OR) of BCOR[0] and BCOD[0].

In a case where code skipping has occurred at the time of performing the first analog-to-digital conversion, in the count value (Di+Ds−Dr−1) after having performed digital CDS type analog-to-digital conversion, the value (Dr) by which the count has increased at the time of performing the first analog-to-digital conversion is larger than the actual value by an amount equivalent to 2 to the low-order bit'th power (2 to the fifth power=32 (LSB)). Accordingly, the count value (Di−Dr) after performing the first analog-to-digital conversion is a value smaller than the actual count value by 32 (LSB). Accordingly, correction to the actual count value can be made by adding 32 (LSB) to the count value after having performed digital CDS type analog-to-digital conversion.

Also, in a case where code skipping has occurred at the time of performing the second analog-to-digital conversion, the value (Ds) by which the count has increased at the time of performing the second analog-to-digital conversion is larger than the actual value by an amount equivalent to 2 to the low-order bit'th power (2 to the fifth power=32 (LSB)). Accordingly, the count value (Di+Ds) after performing the second analog-to-digital conversion is a value larger than the actual count value by 32 (LSB). Accordingly, correction to the actual count value can be made by subtracting 32 (LSB) from the count value after having performed digital CDS type analog-to-digital conversion.

As described above, correction can be easily performed in accordance with the timing at which code skipping has occurred.

[Modification]

Figure 5:
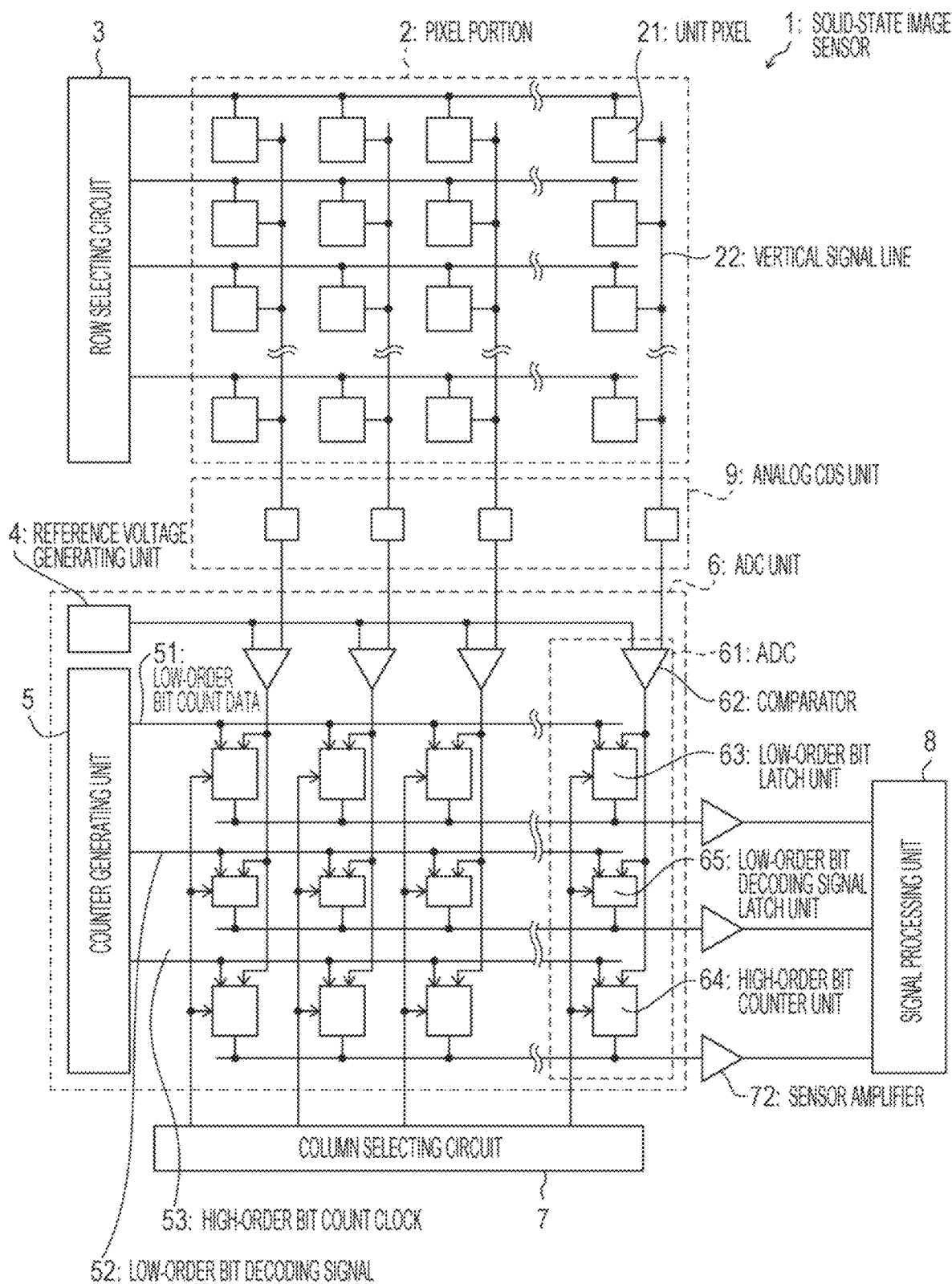
FIG. 5 is a block diagram illustrating the configuration of a modification of the solid-state image sensor according to the embodiment of the present invention.
Figure 6:
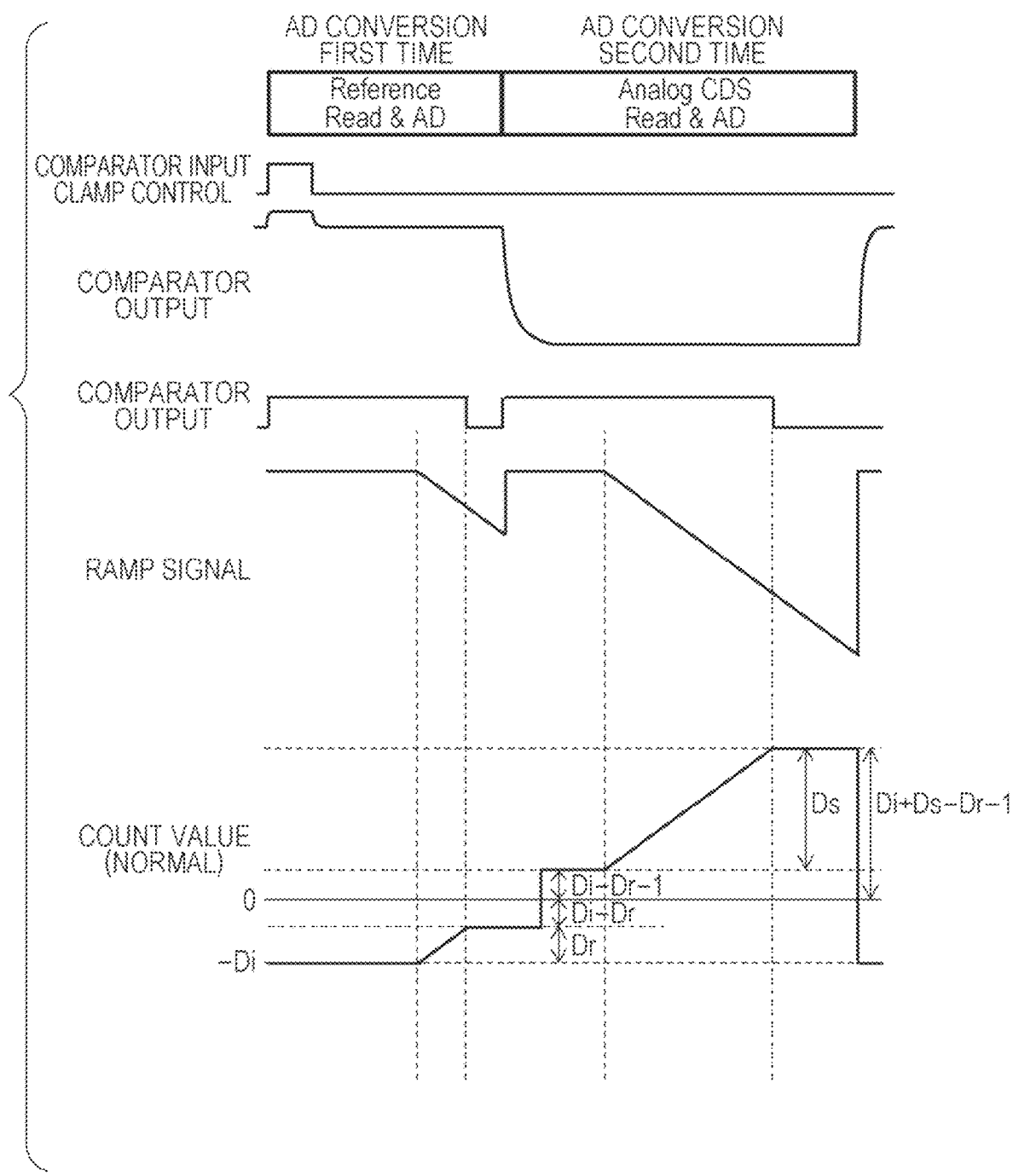
FIG. 6 is a diagram for describing an overview of operations of the analog-to-digital converter.

Although an overview of analog-to-digital conversion using a digital CDS type analog-to-digital converter has been described in the present embodiment, this is not restrictive. A hybrid CDS type analog-to-digital converter illustrated in FIG. 5 and FIG. 6 may be used for analog-to-digital conversion. FIG. 5 is a block diagram illustrating a configuration example of a solid-state image sensor including a hybrid CDS type analog-to-digital converter that performs analog-to-digital conversion one time each at an analog CDS unit 9 and the ADC 61, and FIG. 6 is a diagram for describing an overview of operations of the analog-to-digital converter.

The hybrid CDS type analog-to-digital converter performs analog-to-digital conversion on data in the initial state in a first analog-to-digital conversion at the ADC 61. This operation is referred to as Reference Read & AD. Also, in a second analog-to-digital conversion, analog-to-digital conversion is performed on data after signal accumulation at the analog CDS unit 9. This operation is referred to as Analog CDS Read & AD.

Embodiment 2

An analog-to-digital converter that prevents code skipping in decoding, according to another embodiment of the present invention, will be described below with reference to FIG. 7, FIG. 8, FIG. 13, and FIG. 14. Note that points different from Embodiment 1 will be primarily described in the present embodiment, components having the same functions as components used in Embodiment 1 are denoted by the same reference numerals, and description thereof will be omitted.

Figure 7:
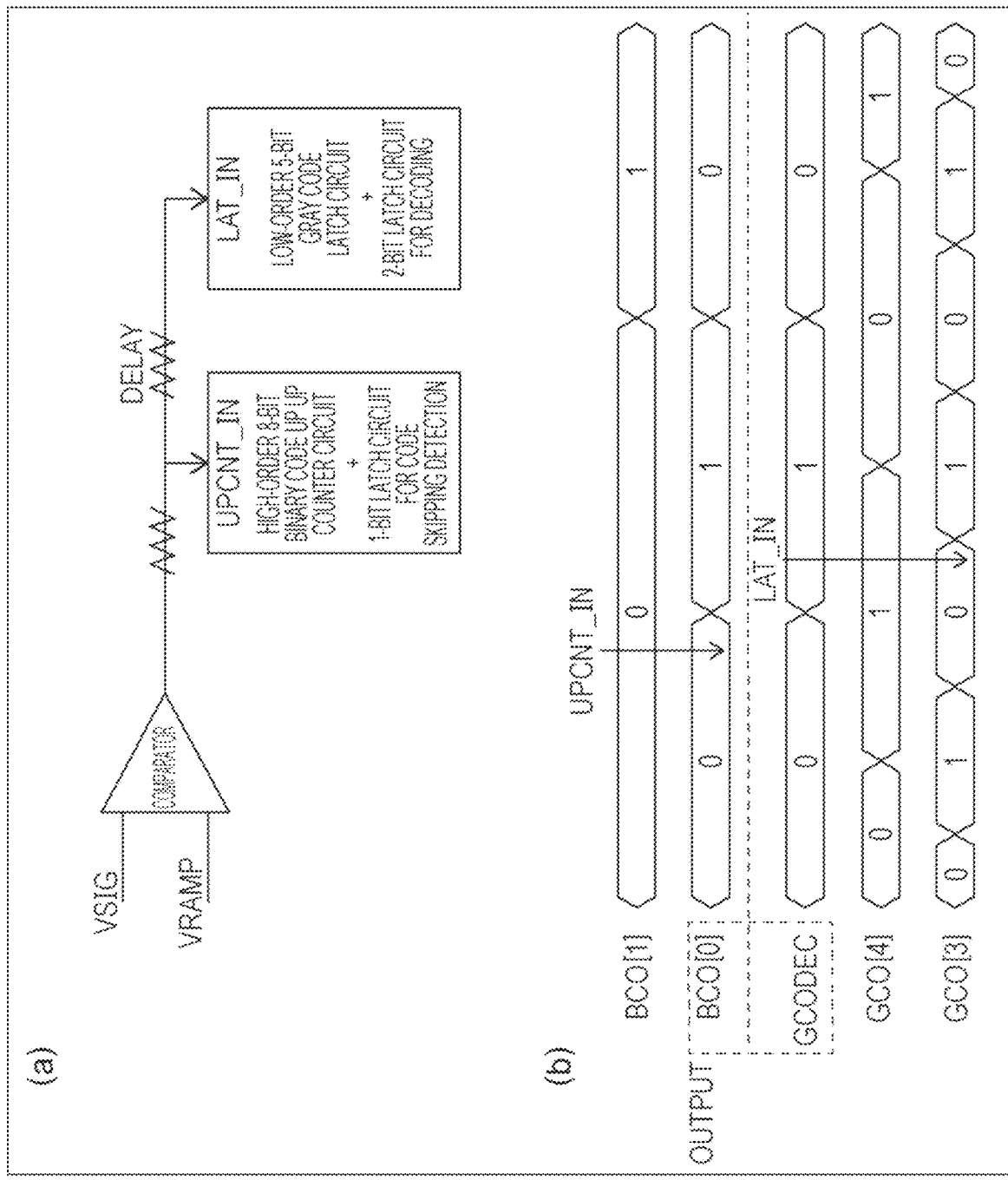
FIG. 7(a) is a schematic diagram illustrating the flow of processing of an analog-to-digital converter according to Embodiment 2 of the present invention, and (b) is a diagram for describing a specific method for determining code skipping in (a).
Figure 13:
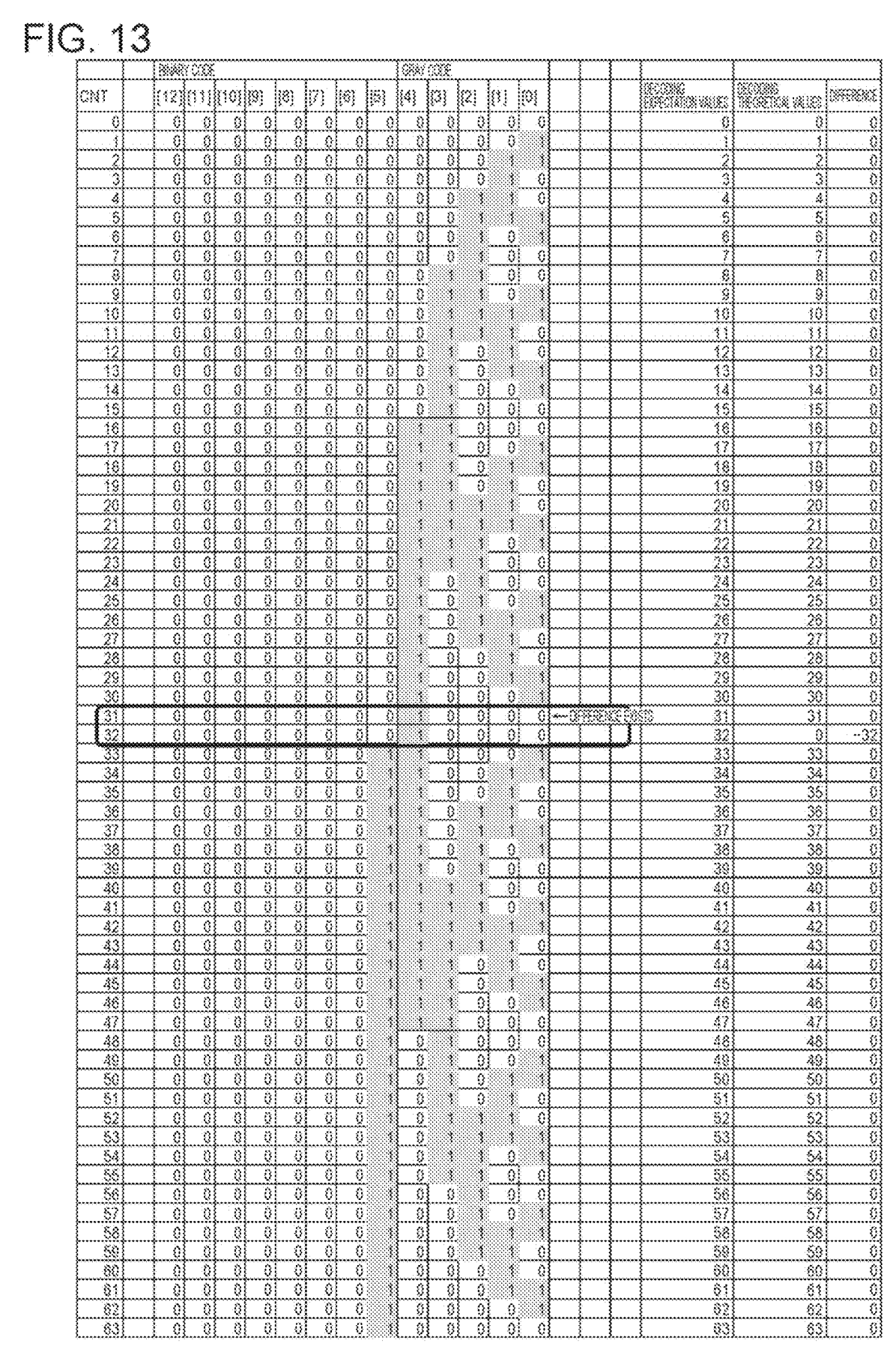
Figure 14:
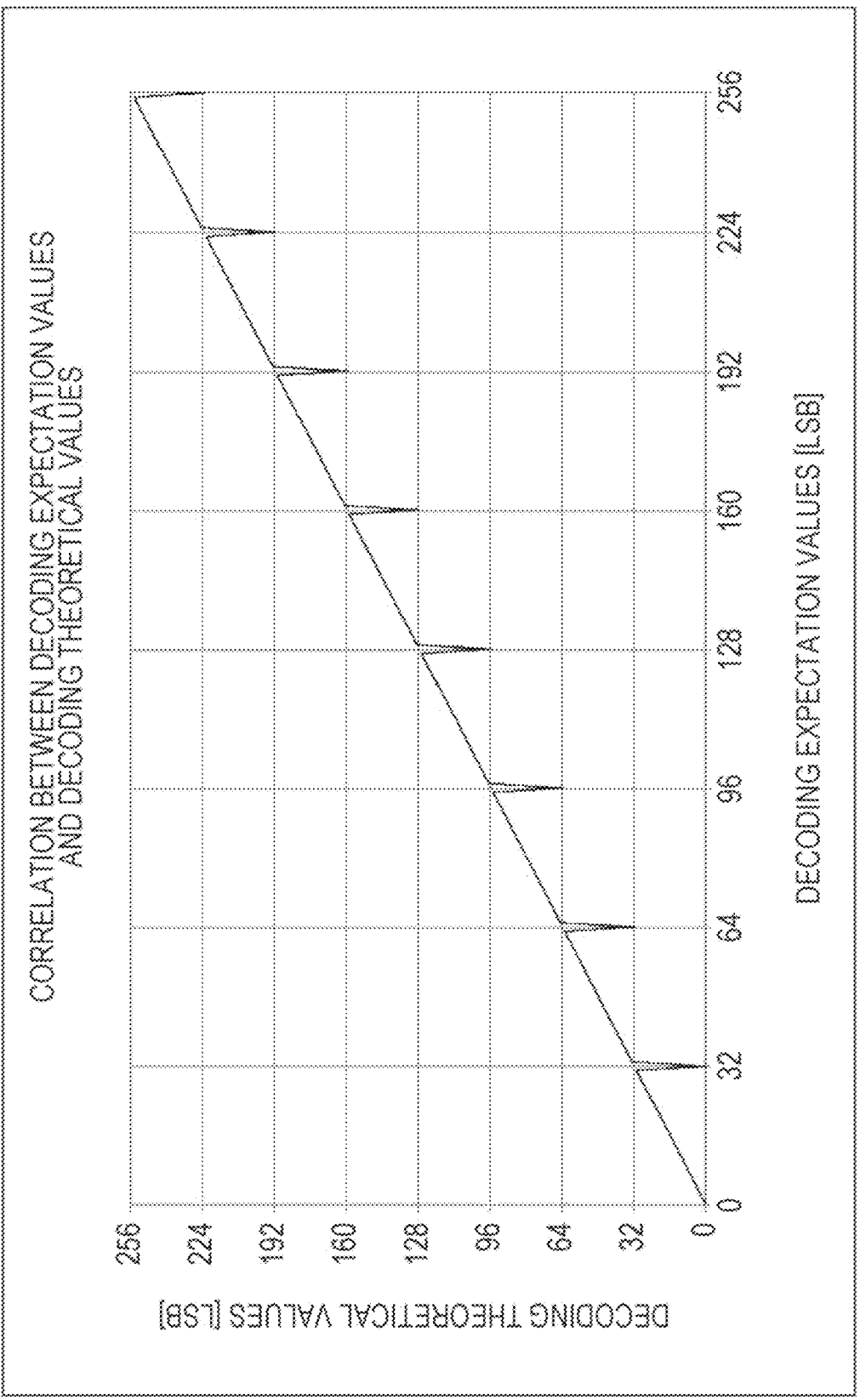
FIG. 14 is a graph illustrating the relation between decoding expectation values and decoding theoretical values in FIG. 13.
Figure 15:
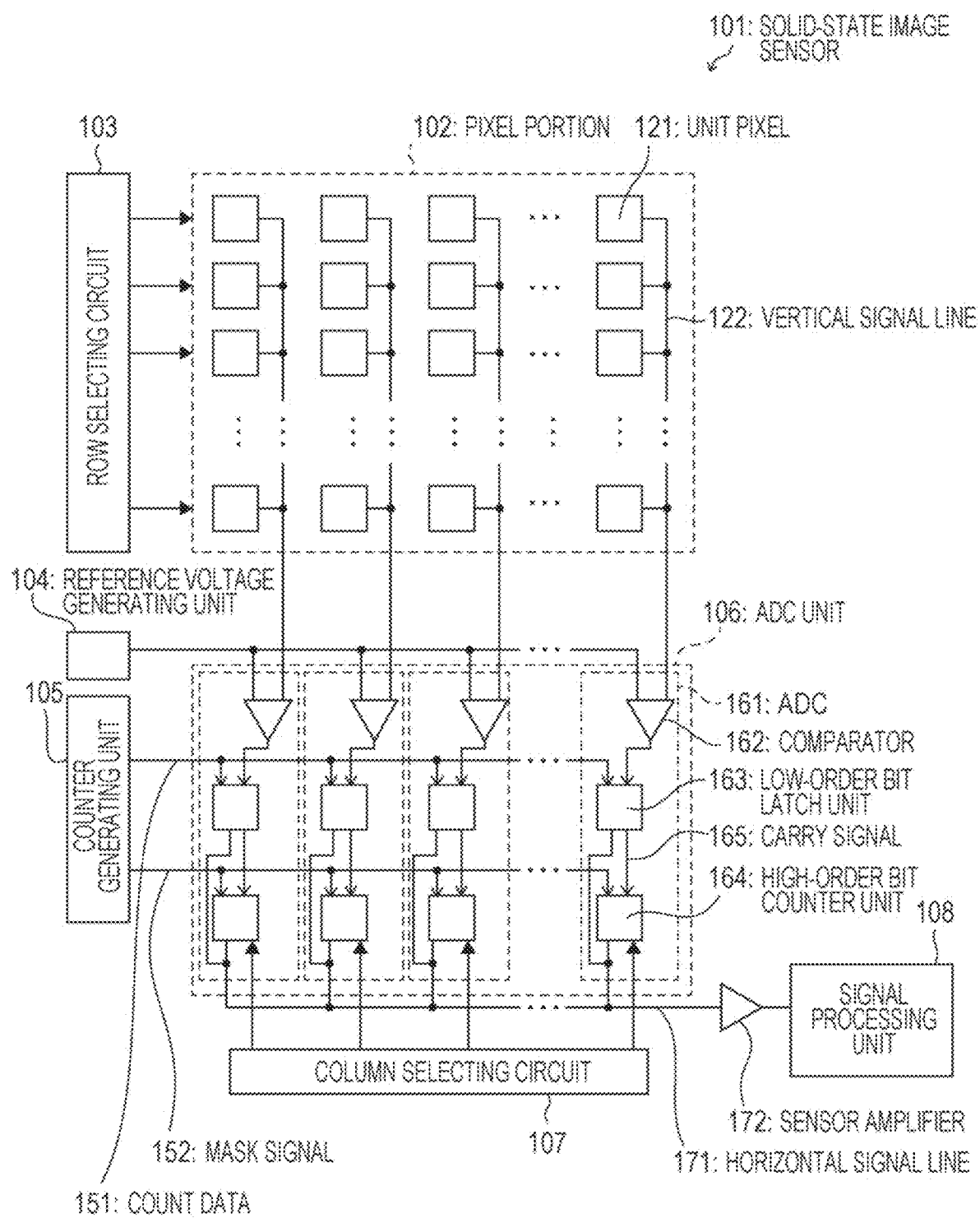
FIG. 15 is a block diagram illustrating a configuration example of a solid-state image sensor in which a conventional analog-to-digital converter is included.

In the present embodiment, the high-order bit counter stops first, and thereafter the low-order bit counter stops, as illustrated in (b) in FIG. 7. Accordingly, in a case where code skipping has occurred, the ADC 61 where the low-order bit counter stops later than the high-order bit counter differs in the point that the counter value is subtracted by an amount equivalent to 2 to the low-order bit'th power, as illustrated in FIGS. 13 and 14, and the signs of correction are reversed from Embodiment 1, as illustrated in (b) through (d) in FIG. 8. Note that (a) in FIG. 8 is the same as (a) in FIG. 4 in Embodiment 1.

According to the above, in a case where code skipping has occurred due to either one of a high-order bit counter and low-order bit counter stopping first, code skipping can be easily detected and corrected.

REFERENCE SIGNS LIST 1 solid-state image sensor
2 pixel portion
3 row selecting circuit
4 reference voltage generating unit
5 counter generating unit
7 column selecting circuit
8 signal processing unit
9 analog CDS unit
21 unit pixel
22 vertical signal line
61 analog-to-digital converter (ADC unit)
62 comparator
63 low-order bit latch unit
64 high-order bit counter unit
65 low-order bit decoding signal latch unit
72 sensor amplifier

The invention claimed is:
1. An analog-to-digital converter that is disposed for at least one column or at least one of unit pixels, and converts input analog signals into digital signals, the analog-to-digital converter comprising:
 a comparator that compares voltage of the analog signals with a reference voltage of which a voltage value varies in accordance with a reference clock;

a low-order bit latch unit that latches a digital code corresponding to the reference clock as a low-order bit, triggered by output of the comparator being inverted;

a high-order bit counter unit that counts one or both of edges of a control signal corresponding to the reference clock, and stops counting of high-order bits, triggered by output of the comparator being inverted;

a low-order bit decoding signal latch unit that latches a low-order bit decoding signal corresponding to the reference clock; and a signal processing unit that compares a value of the low-order bit decoding signal that has been latched and a value of a least significant bit of the high-order bits to detect code skipping, and corrects the detected code skipping.

2. The analog-to-digital converter according to claim 1, wherein the signal processing unit detects the code skipping in a case where the value of the low-order bit decoding signal and the value of the least significant bit differ, and corrects the detected code skipping.

3. The analog-to-digital converter according to claim 1, wherein the signal processing unit detects the code skipping in a case where the value of the low-order bit decoding signal and the value of the least significant bit are equal, and corrects the detected code skipping.

4. A solid-state image sensor, comprising:

a pixel portion that converts incident light into analog signals;

the analog-to-digital converter according to claim 1, that converts the analog signals into digital signals; and a vertical signal line for transferring the analog signals from the pixel portion to the analog-to-digital converter.

* * * * *